United States Patent
Kobayashi et al.

(10) Patent No.: US 7,906,357 B2
(45) Date of Patent: Mar. 15, 2011

(54) P-TYPE LAYER FOR A III-NITRIDE LIGHT EMITTING DEVICE

(75) Inventors: Junko Kobayashi, Sunnyvale, CA (US); Werner K. Goetz, Palo Alto, CA (US); Anneli Munkholm, Mountain View, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 933 days.

(21) Appl. No.: 11/383,456

(22) Filed: May 15, 2006

(65) Prior Publication Data

US 2007/0262342 A1 Nov. 15, 2007

(51) Int. Cl.
*H01L 21/00* (2006.01)
(52) U.S. Cl. ............ 438/47; 438/22; 438/46; 257/103
(58) Field of Classification Search .......... 438/79, 438/98, 103, 956; 257/22, 46, 47, 34, 69
See application file for complete search history.

(56) References Cited

U.S. PATENT DOCUMENTS

| | | | |
|---|---|---|---|
| 6,136,626 A * | 10/2000 | Kidoguchi et al. | 438/38 |
| 6,274,924 B1 | 8/2001 | Carey et al. | |
| 6,635,904 B2 | 10/2003 | Goetz et al. | |
| 6,828,586 B2 | 12/2004 | Fujimoto et al. | |
| 6,833,564 B2 | 12/2004 | Shen et al. | |
| 2001/0019136 A1 | 9/2001 | Sugawara et al. | |
| 2003/0151044 A1 * | 8/2003 | Yamada | 257/14 |
| 2006/0175600 A1 * | 8/2006 | Sato et al. | 257/14 |
| 2007/0026551 A1 * | 2/2007 | Sato et al. | 438/22 |

FOREIGN PATENT DOCUMENTS

| | | |
|---|---|---|
| EP | 0977279 A2 | 2/2000 |
| WO | 02103814 A1 | 12/2002 |
| WO | 2004844366 A1 | 9/2004 |

* cited by examiner

*Primary Examiner* — Michael S Lebentritt
*Assistant Examiner* — Daniel Whalen

(57) ABSTRACT

A semiconductor structure includes a light emitting region, a p-type region disposed on a first side of the light emitting region, and an n-type region disposed on a second side of the light emitting region. At least 10% of a thickness of the semiconductor structure on the first side of the light emitting region comprises indium. Some examples of such a semiconductor light emitting device may be formed by growing an n-type region, growing a p-type region, and growing a light emitting layer disposed between the n-type region and the p-type region. The difference in temperature between the growth temperature of a part of the n-type region and the growth temperature of a part of the p-type region is at least 140° C.

15 Claims, 4 Drawing Sheets

P-TYPE LAYER FOR A III-NITRIDE LIGHT EMITTING DEVICE

BACKGROUND

1. Field of Invention

The present relates to the p-type layers in III-nitride light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device.

FIG. 1 illustrates a conventional III-nitride LED grown on an insulating substrate. The device of FIG. 1 includes a GaN or AlN buffer layer 31, an n-type GaN layer 32, an InGaN active layer 33, a p-type AlGaN layer 34, and a p-type GaN layer 35 which are stacked sequentially on the top face of a sapphire substrate 30. A portion of layers 33, 34, and 35 is removed by etching to expose a portion of n-type GaN layer 32, then an n-side electrode 6 is formed on the exposed portion of n-type GaN layer 32. A p-side electrode 5 is formed on the top face of remaining p-type GaN layer 35.

After growth of n-type layer 32, the growth temperature is reduced in order to grow active layer 33. The growth temperature influences the incorporation of InN into active layer 33. In general, the lower the growth temperature, the more indium is incorporated into a layer, thus low growth temperatures are required to incorporate indium at the desired level. After growing active layer 33 at reduced temperature, the temperature is increased in order to grow p-type AlGaN layer 34 and p-type GaN layer 35.

SUMMARY

In embodiments of the invention, a semiconductor structure includes a light emitting region, a p-type region disposed on a first side of the light emitting region, and an n-type region disposed on a second side of the light emitting region. At least 10% of a thickness of the semiconductor structure on the first side of the light emitting region comprises indium. Some examples of such a semiconductor light emitting device may be formed by growing an n-type region, growing a p-type region, and growing a light emitting layer disposed between the n-type region and the p-type region.

DETAILED DESCRIPTION

Figure 2:
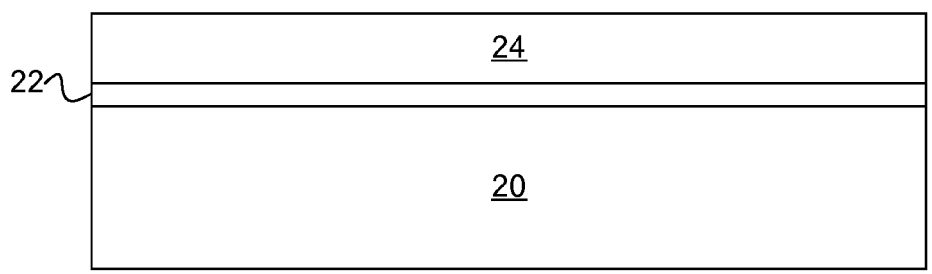
FIG. 2 illustrates a device according to embodiments of the invention.

FIG. 2 illustrates a portion of a semiconductor structure incorporated in a device according to embodiments of the invention. N-type region 20 is typically grown first over a suitable growth substrate. N-type region 20 may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n-type device layers designed for particular optical or electrical properties desirable for the light emitting region to efficiently emit light.

A light emitting region 22 is grown over n-type region 20. The light emitting region may include one or more thick or thin light emitting layers. Examples of suitable light emitting regions include a light emitting region including a single light emitting layer with a thickness greater than, for example, 50 angstroms, and a multiple quantum well light emitting region including multiple thin quantum well light emitting layers each with a thickness between, for example, 20 and 30 angstroms, separated by barrier layers. In III-nitride devices configured to emit visible light, in particular near-UV through green light, the light emitting layers may be InGaN.

A p-type region 24 is grown over light emitting region 22. Like n-type region 20, p-type region 24 may include multiple layers of different composition, thickness, and dopant concentration.

The n-type region in a III-nitride light emitting device is often GaN, which is generally grown at a temperature greater than 1000° C. InGaN light emitting layers must be grown at a temperature much lower than the growth temperature of the n-type region, in order to incorporate a sufficient amount of indium. For example, light emitting layers configured to emit near-UV through green light may have an InN composition between 8% and 20%, may be grown at a temperature between 850 and 700° C., and are often grown at a temperature between 800 and 715° C. The low growth temperature of the light emitting layer relative to the growth temperature of the n-type region often results in the formation of V-shaped pit defects on the growth surface.

Figure 1:
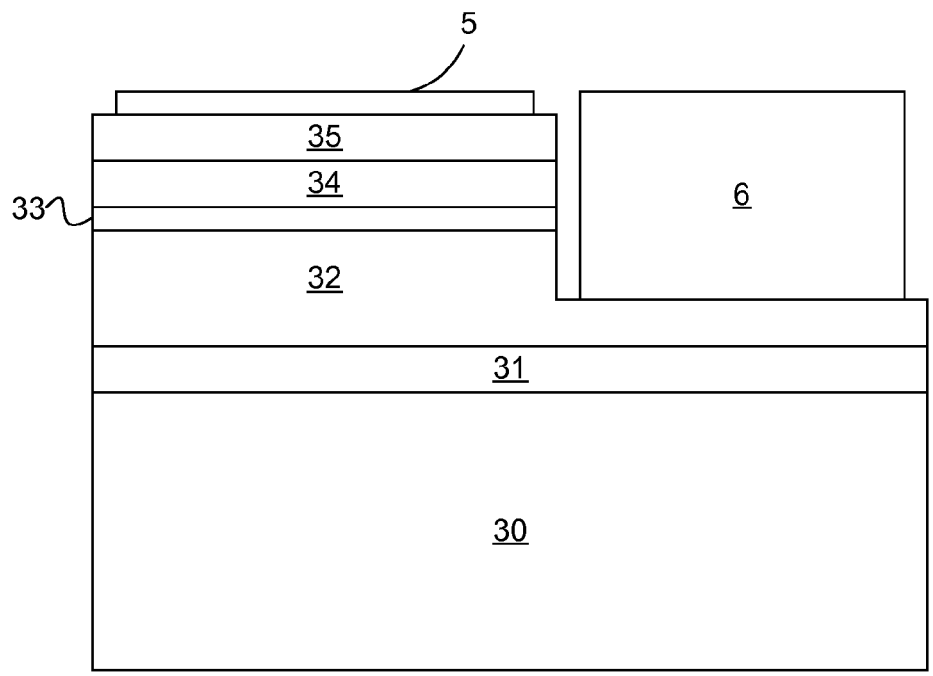
FIG. 1 illustrates a prior art III-nitride LED.

When V-shaped pit defects are present at the device surface, they can degrade the performance of the device, for example by disrupting metallization layers formed over the pitted surface. In general, it is desirable for the p-type layers to smooth the device surface. Therefore, the growth temperature of the AlGaN or GaN p-type layer 34 adjacent to active region 33 in the device of FIG. 1 is generally higher than the growth temperature of the active region, for example greater than 900° C., in order to enhance lateral growth to fill in any pit defects.

However, if the growth temperature of p-type layer 34 is considerably higher than the growth temperature of the active region 33, other structural defects, which can also degrade the performance of the device, may form within light emitting layers or at the interface between the quantum well layers and barrier layers in a multiple quantum well active region.

In accordance with embodiments of the invention, the composition of the p-type region and growth conditions under which the p-type region is grown, such as the growth temperature relative to the growth temperature of other parts of the device, ambient, and precursors used, are selected to improve the performance of the device.

The use of an InN containing p-type layer, rather than a conventional GaN p-type layer, may improve the reliability of the device by preventing or reducing the enlargement and/or formation of pits during growth of the p-type region. The InN containing p-type layer may be grown under an $N_2$ ambient, an $H_2$ ambient, or a mixed $N_2$ and $H_2$ ambient. In various embodiments, at least 10%, at least 25%, at least 50%, or at least 60% of the total thickness of the semiconductor structure on the p-side of the light emitting region contains indium, typically in InGaN or AlInGaN layers. In some embodiments, a portion of the semiconductor structure on the p-side of the light emitting region consists of a superlattice of thin InN-containing layers alternated with thin InN-free layers such as GaN layers, or of thin relatively high InN-composition layers alternated with thin relatively low InN-composition layers. In some examples, such superlattices may have an average InN-composition across the superlattice layers of up to 4% InN.

In some embodiments, the n-type region is grown at a much greater temperature than the p-type region. A part of the n-type region is grown at a first temperature, and a part of the p-type region is grown at a second temperature. The difference between the first and second temperatures is at least 140° C., more preferably at least 150° C. The second temperature is typically less than the first temperature. As described above, n-type region 20 may include multiple layers grown at different temperatures and with different dopant concentrations, including layers that are not intentionally doped. The first temperature referred to above is a growth temperature for a single crystal n-type layer, such as a layer which serves an optical or electrical function such as spreading current or providing an electrical path to a metal contact. The first temperature referred to above is not a growth temperature for a nucleation layer or buffer layer, which are often grown at much lower temperature than single crystal layers and which may be undoped. In some embodiments the first temperature is at least 1000° C., and the n-type layer grown at the first temperature is GaN, AlGaN, or AlInGaN. In some embodiments, the n-type region includes at least one InN-containing layer, such as an InGaN or AlInGaN layer, grown at a temperature less than 1000° C. In embodiments where the n-type region includes an InN-containing layer, the difference between the growth temperature of a portion of the p-type region (often an InN-containing layer) and the growth temperature of a light emitting layer is less than 150° C.

In some embodiments, the part of p-type region 24 grown at a temperature at least 140° C. different from a growth temperature in the n-type region is grown at temperature of at least 830° C. In one example, part of p-type region 24 is InGaN, with a composition between 0 and 4% InN, grown at a temperature between 840 and 910° C.

P-type region 24 often includes multiple regions optimized for different purposes, and may include undoped layers. For example, one or more layers for confining current within the light emitting region and for capping the light emitting region may be disposed adjacent to light emitting region 22. Such capping and/or confinement layers may have a thickness less than 100 angstroms or on the order of hundreds of angstroms, for example 200 to 600 angstroms. One or more layers for spreading current and filling in pits caused by growth of the light emitting region may be formed over the region closest to the light emitting region. Such current spreading layers may have a thickness on the order of hundreds to thousands of angstroms, for example 500 to 1200 angstroms. One or more contact layers on which a metal contact may be disposed may be formed over the current spreading layers. Such contact layers may have a thickness on the order of hundreds of angstroms, for example 100 to 400 angstroms. In some embodiments, the part of p-type region 24 grown at a temperature at least 140° C. different from a growth temperature in the n-type region is a p-type layer and is part or all of the region for spreading current and filling in pits caused by growth of the light emitting region. In various embodiments, the part of p-type region 24 grown at a temperature at least 140° C. different from a growth temperature in the n-type region accounts for at least 10%, at least 25%, at least 50%, or at least 60% of the total thickness of the semiconductor structure on the p-side of the light emitting region.

In some embodiments, the p-type region includes an InN-containing layer, such as an InGaN or AlInGaN layer, grown at a temperature less than 910° C. The temperatures referred to herein are the carrier temperature, i.e. the temperature of the carrier on which the wafer is placed in the reactor. During growth of the p-type region, the temperature may be ramped, for example from a relatively low temperature at which a light emitting layer is grown, to a relatively high temperature at which an InN-containing p-type layer is grown, or for example from a relatively high temperature at which a GaN or low InN composition layer near the light emitting region is grown, to a relatively low temperature at which an InN-containing p-type layer is grown. The InN composition may also be graded, for example from a relatively high InN composition in a light emitting layer to a relatively low InN composition in an InN-containing p-type layer, or for example from a relatively low InN composition in a GaN or low InN composition layer near the light emitting region, to a relatively high InN composition in an InN-containing p-type layer.

Figures 3, 4:
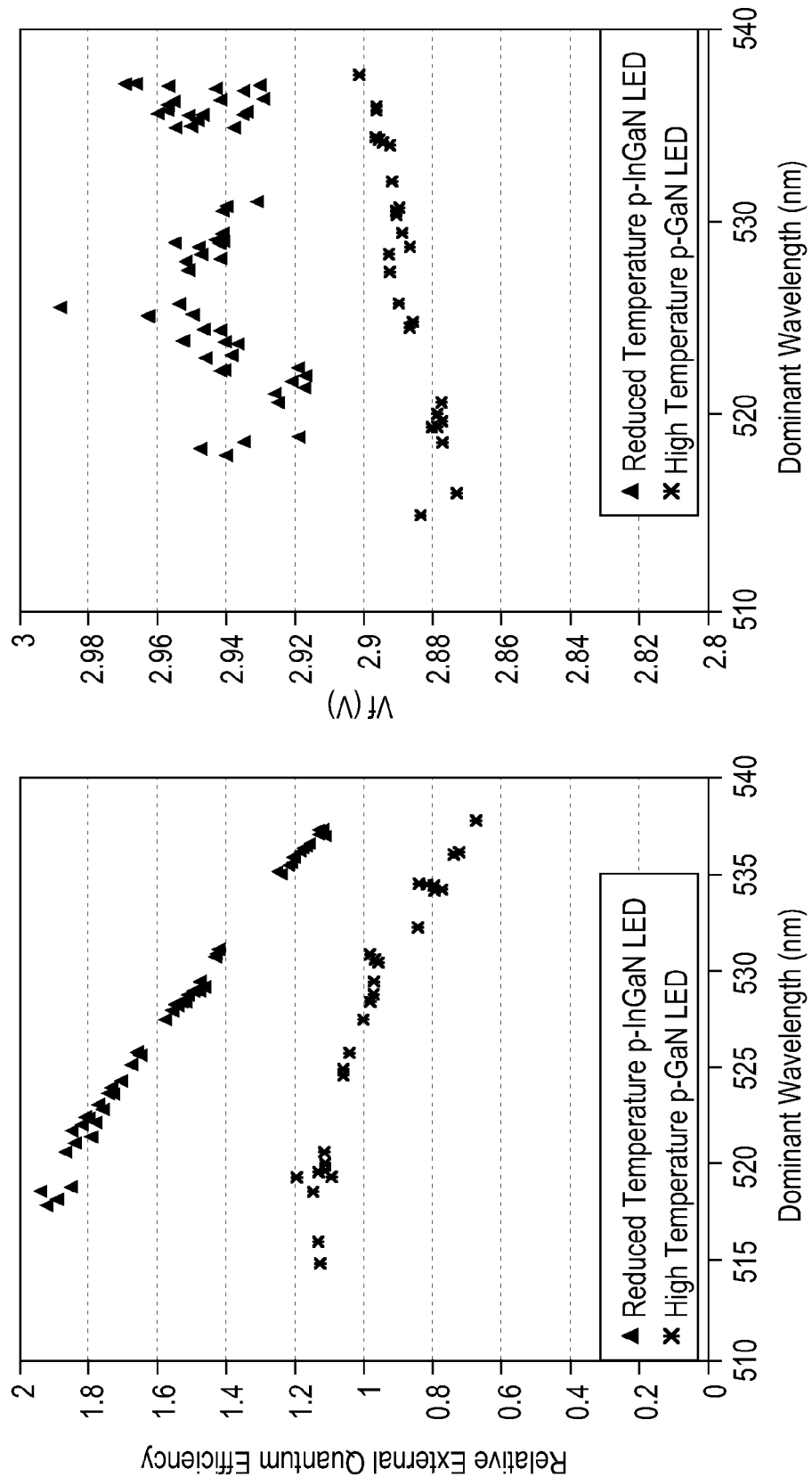
FIG. 3 is a plot of external quantum efficiency as a function of wavelength for devices incorporating a high temperature p-type GaN layer and devices incorporating a reduced temperature p-type InGaN layer.
FIG. 4 is a plot of forward voltage as a function of wavelength for devices incorporating a high temperature p-type GaN layer and devices incorporating a reduced temperature p-type InGaN layer.

In FIGS. 3 and 4, "high" temperature p-type layers refer to devices where the difference between the p-layer growth temperature and the n-layer growth temperature is less than 140° C., while "reduced" temperature p-type layers refer to devices according to embodiments of the invention, where the difference between the p-layer growth temperature and the n-layer growth temperature is at least 140° C.

FIG. 3 is a plot of external quantum efficiency as a function of wavelength for devices incorporating a high temperature p-type GaN layer (asterisks on FIG. 3) and devices incorporating a reduced temperature p-type InGaN layer (triangles on FIG. 3). The external quantum efficiency is the product of the extraction efficiency of a device and the internal quantum efficiency of the device. The internal quantum efficiency is defined as the ratio of photons generated by the light emitting region to carriers supplied to the light emitting region. The extraction efficiency of the devices illustrated in FIG. 3 is constant, thus gains in external quantum efficiency between the devices illustrated in FIG. 3 represent gains in internal quantum efficiency.

As illustrated in FIG. 3, reduced temperature p-type InGaN layers offer improved quantum efficiency over a device with a high temperature p-type GaN layer. At a wavelength of 525 nm, for example, a device with a high temperature p-type GaN layer has a relative external quantum efficiency of about 1. When a reduced temperature p-type InGaN layer, the relative external quantum efficiency improves to over 1.6. The improvement in external quantum efficiency may be due to fewer structure defects formed in light emitting layers or at interfaces between quantum well layers and barrier layers in the active region, a result of the reduced p-type region growth temperature.

FIG. 4 is a plot of forward voltage at a constant current density as a function of wavelength for devices incorporating a high temperature p-type GaN layer and devices incorporating a reduced temperature p-type InGaN layer. As illustrated in FIG. 4, the forward voltage does not significantly increase when a reduced temperature p-type layer is substituted for a high temperature p-type GaN layer. For example, at 525 nm, devices with high temperature p-type GaN layers had forward voltages of about 2.89 V. Devices with reduced temperature p-type InGaN layers had forward voltages between 2.94 and 2.97 V.

Atomic force microscope images of the devices providing the data shown in FIGS. 3 and 4 confirm that in devices with reduced temperature p-type InGaN layers, pits remain open on the device surface. Though a person of skill in the art may expect that these pits could cause reliability problems in devices including reduced temperature p-type layers, the inventors have observed no significant change in reliability when a reduced temperature InGaN is substituted for a high temperature GaN layer.

Figure 7:
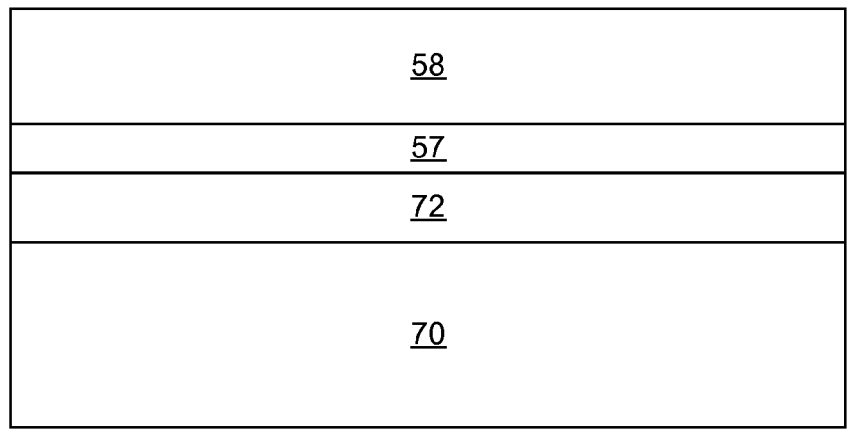
FIG. 7 illustrates a thin film light emitting device.
Figure 5:
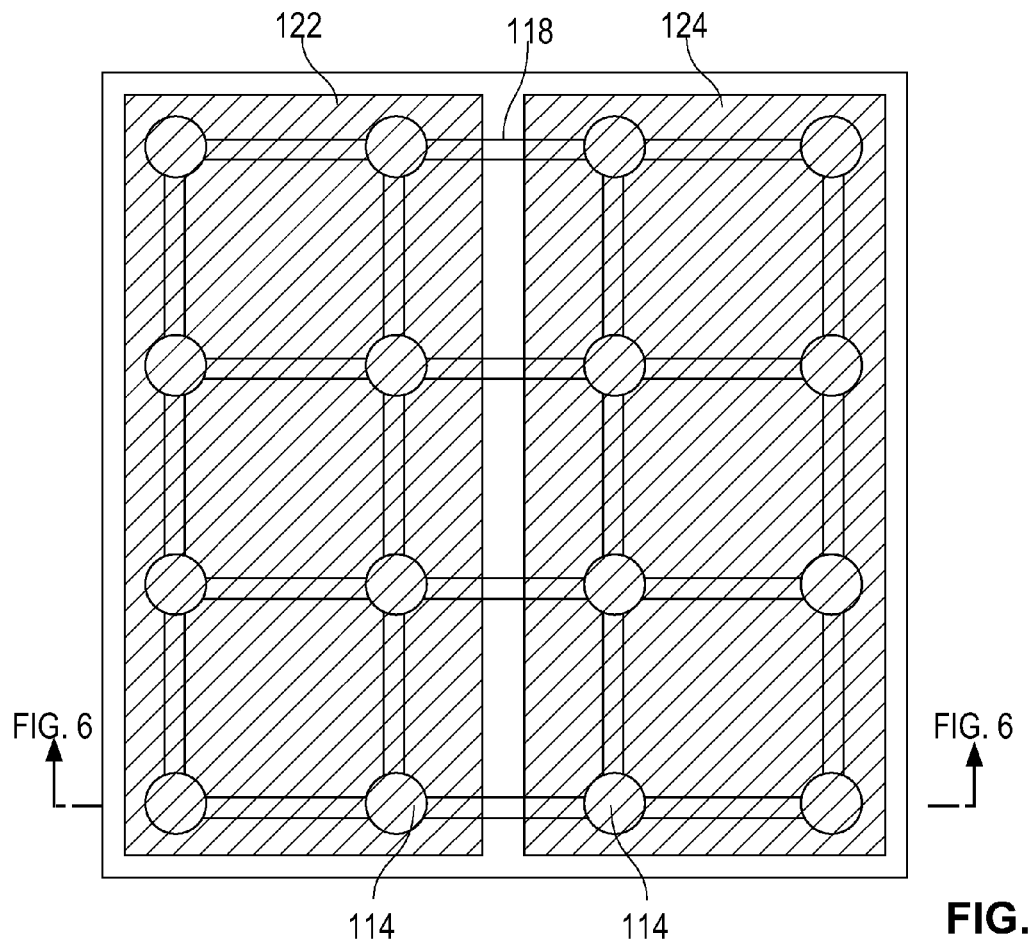
FIGS. 5 and 6 are a plan view and a cross sectional view of a large junction flip chip light emitting device.
Figure 6:
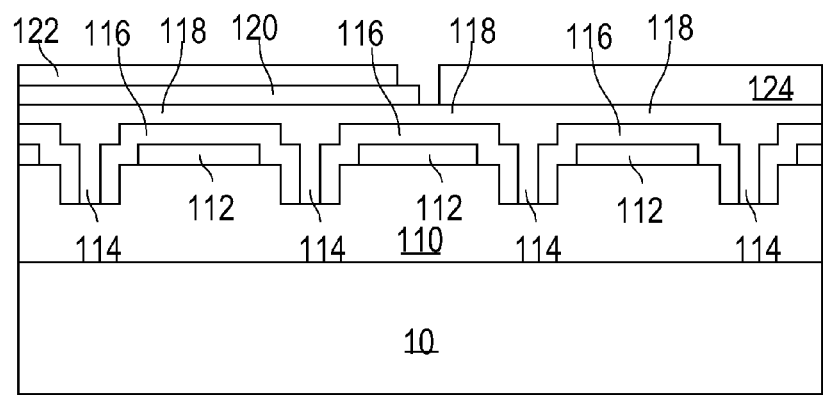

The semiconductor structure illustrated in FIG. 2 may be included in any configuration of a light emitting device. FIGS. 5 and 6 illustrate a flip chip device incorporating the structure of FIG. 2. FIG. 7 illustrates a thin film device incorporating the structure of FIG. 2.

FIG. 5 is a plan view of a large junction device (i.e. an area greater than or equal to one square millimeter). FIG. 6 is a cross section of the device shown in FIG. 5, taken along the axis shown. FIGS. 5 and 6 also illustrate an arrangement of contacts that may be used with the semiconductor structure illustrated in FIG. 2. The device of FIGS. 5 and 6 is described in more detail in U.S. Pat. No. 6,828,586, which is incorporated herein by this reference. The entire semiconductor structure illustrated in FIG. 2 and described above in various examples is represented on FIG. 6 as epitaxial structure 110, grown on a growth substrate 10 which remains a part of the finished device. Multiple vias are formed in which n-type contacts 114 make electrical contact to n-type region 20 of FIG. 2. P-type contacts 112 are formed on the remaining portions of p-type region 24 of FIG. 3. The individual n-type contacts 114 formed in the vias are electrically connected by conductive regions 118. The device may be flipped relative to the orientation illustrated in FIGS. 5 and 6 and mounted on a mount (not shown) contact-side down such that light is extracted from the device through substrate 10. N-type contacts 114 and conductive regions 118 make electrical contact to the mount by n-type connection region 124. Underneath n-type connection region 124, the p-type contacts 112 are isolated from n-type contacts 114, conductive regions 118, and n-type connection region 124 by dielectric 116. P-type contacts 112 make electrical contact to the mount by p-type connection region 122. Underneath p-type connection region 122, n-type contacts 114 and conductive regions 118 are isolated from p-type connection region 122 by dielectric 120.

FIG. 7 is a cross sectional view of a thin film device, a device from which the growth substrate is removed. The device illustrated in FIG. 7 may be formed by growing the semiconductor structure 57 of FIG. 2 on a conventional growth substrate 58, bonding the device layers to a host substrate 70, then removing growth substrate 58. For example, n-type region 31 is grown over substrate 58. N-type region 20 may include optional preparation layers such as buffer layers or nucleation layers, and optional release layers designed to facilitate release of the growth substrate or thinning of the epitaxial layers after substrate removal. Light emitting region 22 is grown over n-type region 20, followed by p-type region 24. One or more metal layers 72, including, for example, ohmic contact layers, reflective layers, barrier layers, and bonding layers, are deposited over p-type region 24.

The device layers are then bonded to a host substrate 70 via the exposed surface of metal layers 72. One or more bonding layers (not shown), typically metal, may serve as compliant materials for thermo-compression or eutectic bonding between the epitaxial structure and the host substrate. Examples of suitable bonding layer metals include gold and silver. Host substrate 70 provides mechanical support to the epitaxial layers after the growth substrate is removed, and provides electrical contact to p-type region 24. Host substrate 70 is generally selected to be electrically conductive (i.e. less than about 0.1 Ωcm), to be thermally conductive, to have a coefficient of thermal expansion (CTE) matched to that of the epitaxial layers, and to be flat enough (i.e. with an root mean square roughness less than about 10 nm) to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as AlN, compressed diamond, or diamond layers grown by chemical vapor deposition.

The device layers may be bonded to host substrate 70 on a wafer scale, such that an entire wafer of devices are bonded to a wafer of hosts, then the individual devices are diced after bonding. Alternatively, a wafer of devices may be diced into individual devices, then each device bonded to host substrate 70 on a die scale.

Host substrate 70 and semiconductor structure 57 are pressed together at elevated temperature and pressure to form a durable bond at the interface between host substrate 70 and metal layers 72, for example a durable metal bond formed between metal bonding layers (not shown) at the interface. The temperature and pressure ranges for bonding are limited on the lower end by the strength of the resulting bond, and on the higher end by the stability of the host substrate structure, metallization, and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range is, for example, about 200° C. to about 500° C. A suitable pressure range is, for example, about 100 psi to about 300 psi. Growth substrate 58 is then removed.

In order to remove a sapphire growth substrate, portions of the interface between substrate 58 and semiconductor structure 57 are exposed, through substrate 58, to a high fluence pulsed ultraviolet laser in a step and repeat pattern. The exposed portions may be isolated by trenches etched through the crystal layers of the device, in order to isolate the shock wave caused by exposure to the laser. The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 500 mJ/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 58. The resulting structure includes semiconductor structure 57 bonded to host substrate 70. In some embodiments, the growth substrate may be removed by other means, such as etching, lapping, or a combination thereof.

After the growth substrate is removed, semiconductor structure 57 may be thinned, for example to remove portions of n-type region 20 closest to substrate 58 and of low material quality. The epitaxial layers may be thinned by, for example, chemical mechanical polishing, conventional dry etching, or photoelectrochemical etching (PEC). The top surface of the epitaxial layers may be textured or roughened to increase the amount of light extracted. A contact (not shown) is then formed on the exposed surface of n-type region 20. The n-contact may be, for example, a grid. The layers beneath the n-contact may be implanted with, for example, hydrogen to prevent light emission from the portion of light emitting region 22 beneath the n-contact. Secondary optics known in the art such as dichroics or polarizers may be applied onto the emitting surface to provide further gains in brightness or conversion efficiency.

Figure 8:
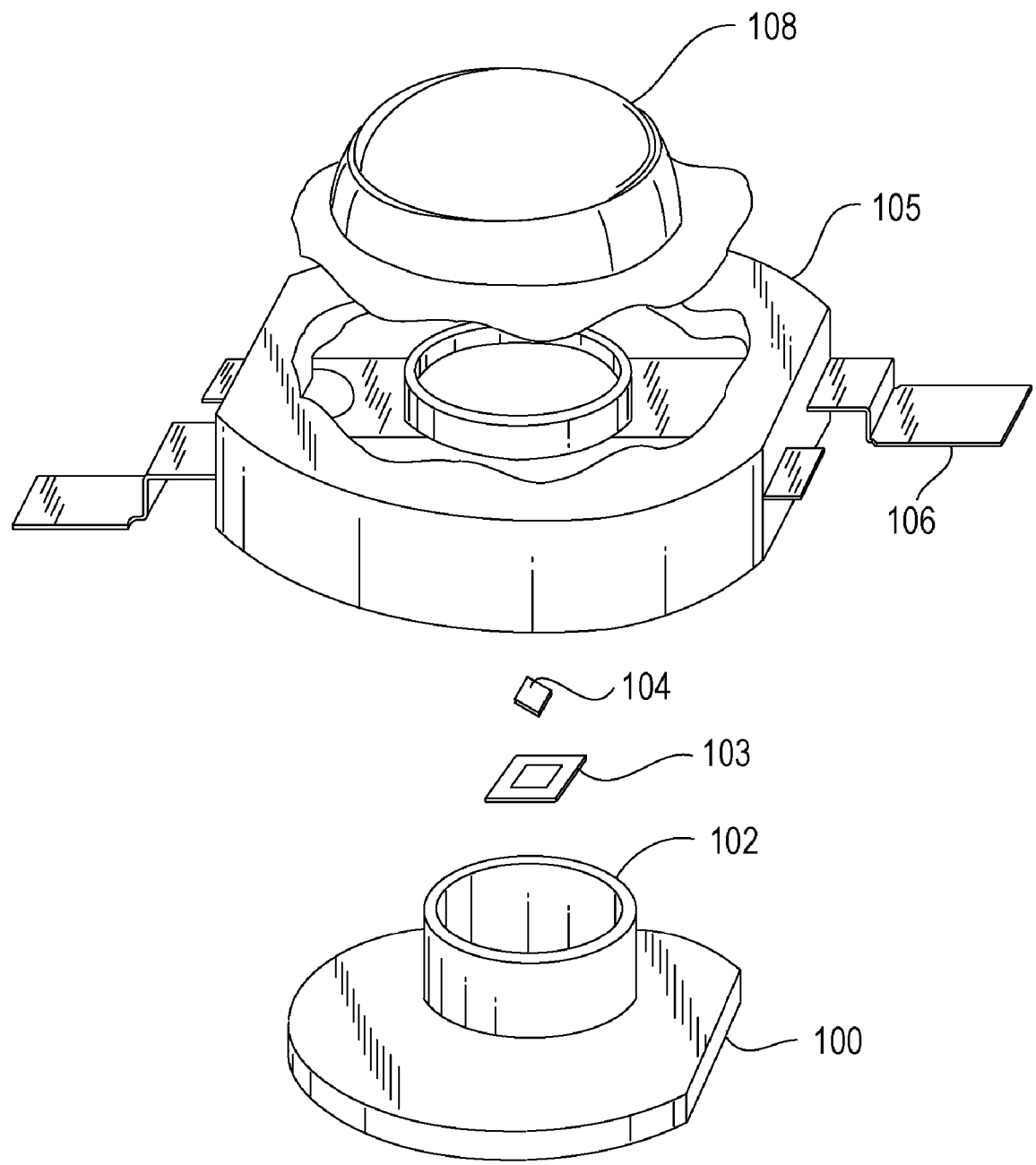
FIG. 8 is an exploded view of a packaged light emitting device.

FIG. 8 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of making a semiconductor light emitting device, the method comprising:
    growing at a first temperature a portion of an n-type semiconductor region;
    growing a group III-nitride light emitting layer over the n-type semiconductor region; and
    growing at a second temperature a portion of a p-type semiconductor region over the light emitting layer, wherein the portion grown at the second temperature comprises indium;
    wherein a difference between the first temperature and the second temperature is at least 140° C.; and
    wherein at least 10% of the total thickness of all semiconductor materials grown over the light emitting layer comprises indium.

2. The method of claim 1 wherein a difference between the first temperature and the second temperature is at least 150° C.

3. The method of claim 1 wherein the first temperature is at least 1000° C.

4. The method of claim 1 wherein the second temperature is less than 900° C.

5. The method of claim 1 wherein the portion of the p-type region grown at the second temperature is AlInGaN.

6. The method of claim 1 wherein the portion of the p-type region grown at the second temperature is InGaN.

7. The method of claim 6 wherein an InN composition in the portion of the p-type region grown at the second temperature is less than 4%.

8. The method of claim 1 wherein growing a portion of a p-type region comprises growing the portion of the p-type region under an ambient comprising $N_2$.

9. The method of claim 1 wherein the III-nitride light emitting layer is a first quantum well layer, the method further comprising:
    growing a barrier layer overlying the first quantum well; and
    growing a second quantum well overlying the barrier layer.

10. The method of claim 1 wherein the light emitting layer is configured to emit light having a peak wavelength of at least 500 nm.

11. The method of claim 1 further comprising:
    forming contacts electrically connected to the n-type region and the p-type region; and
    disposing a cover over the light emitting region.

12. The method of claim 1 wherein the n-type region is a single crystal region.

13. A method of making a semiconductor light emitting device, the method comprising:
    growing an n-type semiconductor region, the n-type semiconductor region including at least one layer comprising indium;
    growing at a first temperature a III-nitride light emitting layer over the n-type semiconductor region; and
    growing at a second temperature a portion of a p-type semiconductor region over the light emitting layer, wherein the portion of the p-type semiconductor region grown at the second temperature comprises indium;
    wherein a difference between the first temperature and the second temperature is no more than 150° C.; and
    wherein at least 10% of the total thickness of all semiconductor materials grown over the light emitting layer comprises indium.

14. The method of claim 13 wherein the first temperature is less than 900° C.

15. The method of claim 13 wherein the second temperature is less than 900° C.

* * * * *